(12) United States Patent
Brandenburg et al.

(10) Patent No.: US 7,553,680 B2
(45) Date of Patent: Jun. 30, 2009

(54) METHODS TO PROVIDE AND EXPOSE A DIAGNOSTIC CONNECTOR ON OVERMOLDED ELECTRONIC PACKAGES

(75) Inventors: Scott D. Brandenburg, Kokomo, IN (US); Jeenhuei S. Tsai, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 647 days.

(21) Appl. No.: 10/914,695

(22) Filed: Aug. 9, 2004

(65) Prior Publication Data

US 2006/0027394 A1    Feb. 9, 2006

(51) Int. Cl.
   *H01L 21/66*    (2006.01)
(52) U.S. Cl. .................. 438/15; 257/E21.521; 174/251; 174/267
(58) Field of Classification Search .................. 438/18, 438/112, 127, 15, 25, 26, 51, 64–67, 124, 438/126, FOR. 367, FOR. 371–FOR. 374, 438/FOR. 379, FOR. 384, 14, 19, 42, FOR. 38; 257/48, 795, 922, E21.502, E21.504, E21.531, 257/685, 687, 693, 697, 785–790, E21.521; 324/765; 174/257, 520–523; 439/170; 361/752
   See application file for complete search history.

(56) References Cited

U.S. PATENT DOCUMENTS

| | | | |
|---|---|---|---|
| 3,652,333 A | | 3/1972 | Warren |
| 4,174,531 A | | 11/1979 | McCarthy et al. |
| 5,288,944 A | * | 2/1994 | Bronson et al. .............. 174/539 |
| 5,352,123 A | * | 10/1994 | Sample et al. ................ 439/61 |
| 5,600,181 A | * | 2/1997 | Scott et al. .................. 257/723 |
| 5,726,493 A | * | 3/1998 | Yamashita et al. ........... 257/698 |
| 6,018,463 A | * | 1/2000 | Winslow et al. ............. 361/803 |
| 6,046,101 A | * | 4/2000 | Dass et al. ................... 438/624 |
| 6,075,911 A | * | 6/2000 | Goto ............................ 385/31 |
| 6,100,114 A | * | 8/2000 | Milkovich et al. ........... 438/127 |
| 6,180,045 B1 | * | 1/2001 | Brandenburg et al. ........ 264/263 |
| 6,285,551 B1 | | 9/2001 | Brandenburg et al. ........ 361/704 |
| 6,303,860 B1 | * | 10/2001 | Van Rens et al. ............. 174/521 |

(Continued)

FOREIGN PATENT DOCUMENTS

JP       09283195       10/1997

(Continued)

OTHER PUBLICATIONS

European Search Report dated Nov. 25, 2005.

*Primary Examiner*—W. David Coleman
*Assistant Examiner*—Latanya Crawford
(74) *Attorney, Agent, or Firm*—Jimmy L. Funke

(57) ABSTRACT

An overmolded electronic assembly is provided having a circuit board with electronic devices and a diagnostic connection. The diagnostic connection includes electrical conductors having a distal end projecting above a first side of the circuit board, for example, circuit pads having solder thereon or conductive pins oriented substantially perpendicular to the circuit board. The electrical conductors are overmolded with sealing material along with the other electronic devices and circuit board area. The encapsulation or sealing material overlying the electrical conductors is removed from the outside surface down to at least the distal end of the electrical conductors. The sealing material may be removed, for example, by mechanical cutting, laser cutting, or high pressure jet erosion, for example, by a high pressure water or liquid nitrogen stream.

4 Claims, 4 Drawing Sheets

U.S. PATENT DOCUMENTS

| | | | |
|---|---|---|---|
| 6,307,749 B1 * | 10/2001 | Daanen et al. | 361/704 |
| 6,459,144 B1 * | 10/2002 | Pu et al. | 257/667 |
| 6,525,413 B1 * | 2/2003 | Cloud et al. | 257/686 |
| 6,693,239 B2 | 2/2004 | Myers et al. | 174/52.2 |
| 6,773,938 B2 * | 8/2004 | Wood et al. | 438/15 |
| 7,185,426 B1 * | 3/2007 | Hiner et al. | 29/841 |
| 2002/0000815 A1 | 1/2002 | Fjelstad et al. | |
| 2002/0025600 A1 * | 2/2002 | Lowry | 438/106 |
| 2003/0141529 A1 * | 7/2003 | Seto et al. | 257/299 |
| 2003/0234442 A1 * | 12/2003 | Su | 257/678 |
| 2004/0056338 A1 * | 3/2004 | Crowley et al. | 257/676 |
| 2004/0092174 A1 * | 5/2004 | Eichorn et al. | 439/876 |
| 2004/0113644 A1 | 6/2004 | Wood et al. | |

FOREIGN PATENT DOCUMENTS

| | | |
|---|---|---|
| JP | 10246736 | 9/1998 |
| JP | 2003167004 | 6/2003 |

* cited by examiner

METHODS TO PROVIDE AND EXPOSE A DIAGNOSTIC CONNECTOR ON OVERMOLDED ELECTRONIC PACKAGES

TECHNICAL BACKGROUND

The present invention relates to diagnostic connections for overmolded electronic assemblies that include a circuit board having electronic devices.

BACKGROUND OF THE INVENTION

Circuit boards with electronic devices, for example, flip chips or other semiconductors, must often be protected from the environment in which the board is employed. The method of protection generally must also allow a method of accessing the electronic devices for failure analysis.

One widely practiced protection approach is to enclose a circuit board in an assembly composed of a pair of case halves. The case halves are secured together with fasteners to form an enclosure that supports and protects the circuit board and electronic devices within. The assembly typically includes a sealing material between the case halves to exclude moisture from the enclosure. The resulting package must then be tested for leakage to ensure the package was properly assembled and sealed.

Although the above-described assembly process provides a package, which may be disassembled for failure analysis of the electronic devices, the assembly process is labor intensive and involves a number of components. A less expensive and less complicated assembly process is highly desirable. One solution is an overmolded electronic assembly such as that disclosed in U.S. Pat. No. 6,180,045, Brandenburg et al., the assignee of which is the assignee of the present application. The overmolded electronic assembly includes a circuit board having electronic devices and an overmolded body that encapsulates the circuit board and devices, forming a moisture impermeable seal.

The above-noted overmolded electronic assembly provides an inexpensive and uncomplicated method for encasing the circuit board and electronic devices in a protective enclosure and also provides benefits in thermal management, reliability, and vibration. However, the overmolding or sealing material presents a difficult obstacle for subsequent failure analysis.

Because the entire electronic assembly or at least all electronic devices is generally encapsulated with the overmolding material, it is difficult to determine the faulty area of the electronic circuit or which electronic device is malfunctioning or failed. Decapsulation of the entire circuit board and electronic devices is very difficult and time consuming and may lead to damage of the electronic devices or circuit board.

SUMMARY OF THE INVENTION

The present invention relates to an overmolded electronic assembly having a circuit board with electronic devices and a diagnostic connection. The diagnostic connection includes electrical conductors having a distal end projecting above a first side of the circuit board, for example, circuit pads having solder thereon or conductive pins oriented substantially perpendicular to the circuit board. The electrical conductors are overmolded with sealing material along with the other electronic devices and circuit board area. The sealing material is a dielectric, for example, a thermoset polymer base such as epoxy that may include another material such as a fill material. According to the present invention, in order to provide a diagnostic connection to the circuit and electronic devices, the encapsulation or sealing material overlying the electrical conductors is removed from the outside surface down to at least the distal end of the electrical conductors. The arrangement of the electrical conductors and the method of removal of the sealing material prevents damage to the circuit and electronic devices and provides instrumentation used during product development and facilitates failure analysis. The sealing material may be removed, for example, by mechanical cutting, laser cutting, or high pressure jet erosion, for example, by a high pressure water or liquid nitrogen stream.

To further facilitate easy removal of sealing material in the vicinity of the electrical conductors, a first sealing material, for example, silicone or a plastic cap, may be used to first encapsulate the electrical conductors. Then a second sealing material may be used to encapsulate the first sealing material and at least a portion of the first side of the circuit board and the electronic devices. After removal of the second sealing material overlying the first sealing material, the first sealing material may then be removed from the electrical conductors, generally leaving a void through which a test circuit conductor such as probes and a probe body may be positioned and coupled with the electrical conductors.

A first exemplary embodiment of the invention provides a method of providing a diagnostic connection for a circuit assembly, including the steps of providing a circuit board having a first side, coupling electrical conductors to the circuit board, the electrical conductors having a distal end projecting above the first side of the circuit board, encapsulating the electrical conductors with a first sealing material, and removing at least a portion of the first sealing material to expose the distal end of the electrical conductors.

A second exemplary embodiment of the invention provides a circuit assembly including a circuit board having a first side, an electrical conductor coupled with the circuit board, the electrical conductor having a distal end protruding above the first side of the circuit board, a first material encapsulating the electrical conductor, and a second material encapsulating the first material and at least a portion of the first side of the circuit board.

Advantageously, the present invention facilitates failure analysis and instrumentation used during product development of an encapsulated electronic assembly with minimal decapsulation of the overmolding material and with substantially reduced risk of damaging the circuit and electronic devices. The present invention further provides an inexpensive and efficient method of sealing an electronic assembly from environmentals while facilitating simplified and efficient diagnostic connection for failure analysis.

BRIEF DESCRIPTION OF THE DRAWINGS

The present invention will now be described, by way of example, with reference to the accompanying drawings, in which.

Figure 1A:
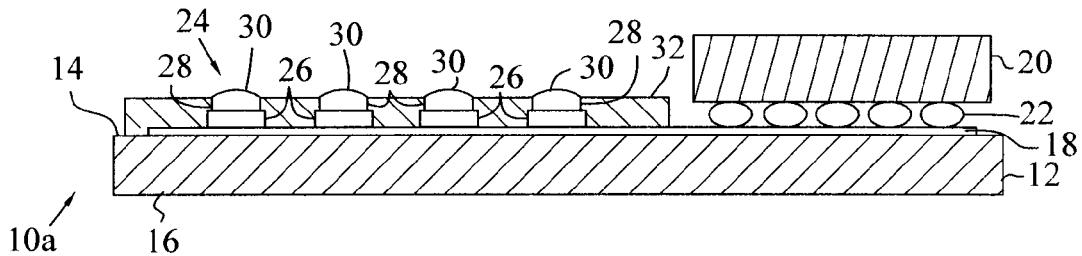
FIG. 1A is a cross-sectional elevation view of a first exemplary electronic assembly according to the present invention.

Corresponding reference characters indicate corresponding parts throughout the several views. Although the drawings represent embodiments of the present invention, the drawings are not necessarily to scale and certain features may be exaggerated in order to better illustrate and explain the present invention. The exemplifications set out herein illustrate four embodiments of the invention and such exemplification is not to be construed as limiting the scope of the invention in any manner.

DESCRIPTION OF INVENTION

The embodiments disclosed below are not intended to be exhaustive or limit the invention to the precise forms disclosed in the following detailed description. Rather, the embodiments are chosen and described so that others skilled in the art may utilize their teachings.

FIGS. 1A-1D represent a first exemplary embodiment and method of providing and exposing a diagnostic connection for an overmolded electronic assembly. Referring to FIG. 1A, electronic assembly 10a includes circuit board 12 having a first side surface 14 and an oppositely located second side surface 16. Circuit board 12 may be a laminate, printed circuit board (PCB), ceramic, or any other suitable substrate or other circuit board material known in the art. Circuit board 12 may include electrical circuit 18 printed, for example, on first side 14; however, circuit 18 may be provided and located in an alternative form or location. Additionally, electronic assembly 10a includes components such as electronic device 20, in this embodiment shown as a flip chip coupled to electrical circuit 18 and circuit board 12, for example, by solder bumps 22; however, electronic assembly 10a may include additional or alternative electrical or non-electrical components.

In order to provide a diagnostic connection for post-assembly failure analysis of electrical device 20, electrical circuit 18, and any other components that may be provided on electronic assembly 10a, electrical conductors 24 are coupled to desired test points (not shown) of electrical circuit 18. Electrical conductors 24 may be used for probing and testing electronic assembly 10a for failure analysis. For example, electrical conductors 24 may provide a diagnostic connection to a logic analyzer or other suitable test equipment. To facilitate such a diagnostic connection, a wideband serial high-speed bus may be used, for example, NEXUS/GEPDIS (IEEE-ISTO 5001™-1999, The Nexus 5001™ Forum Standard for a Global Embedded Processor Debug Interface is an open industry standard that provides a general-purpose interface for the software development and debug of embedded processors. ©1 999-2003, IEEE Industry Standards and Technology Organization. All rights reserved. The IEEE-ISTO is affiliated with the IEEE and the IEEE Standards Association. IEEE-ISTO 5001 and Nexus 5001 Forum are trademarks of the IEEE-ISTO. See http://www.nexus5001.org).

The diagnostic connection provided by electrical conductors 24 may be used in conjunction with a suitable interface and analysis equipment to determine the area of electrical circuit 18, electronic device 20, or other component associated with electronic assembly 10a that has failed or is malfunctioning.

Electrical conductors 24 of first exemplary embodiment electronic assembly 10a include circuit pads 26 coupled to electrical circuit 18. Circuit pads 26 may extend distally from first side 14 of circuit board 12 and be the same thickness or an extended thickness above electrical circuit 18. Electrical conductors 24 may also include solder pads 28, or another suitable conductive material for extending electrical conductors 24 distally from first side 14 of circuit board 12. For example, solder pads 28 may be printed on top of circuit pads 26 in order to provide distal end 30 above the level of electrical circuit 18. For example, distal end 30 of solder pads 28 may extend distally from first side 14 of circuit board 12 by approximately 6 mils. Electronic assembly 10a may also include thickened solder mask 32 in the area of electrical conductors 24. Thickened solder mask 32 enables a solder pads 28 to be printed to a greater distal height from first side 14. The greater distal height increases the machining tolerances that may be used for forming access 38, as described below.

Figure 1B:
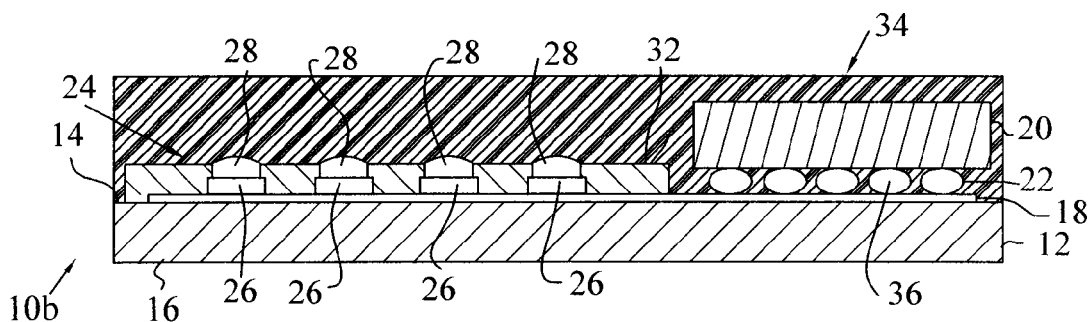
FIG. 1B is a cross-sectional elevation view of the first exemplary embodiment of FIG. 1A, showing sealing material encapsulating the electronic assembly.

Referring to FIG. 1B, overmolded electronic assembly 10b is first exemplary electronic assembly 10a of FIG. 1 with electrical conductors 24 and at least a portion of electrical circuit 18 and electronic device 20 encapsulated by sealing material 34. Sealing material 34 is a dielectric such as a polymeric material, for example, a thermoset polymer base such as epoxy. Sealing material 34 may also include particulate fill material (not shown) for providing desirable characteristics, for example, to provide underflow 36 between solder bumps 22 of electronic device 20. Generally, sealing material 34 provides a moisture impermeable seal for electronic assembly 10a. Additionally, sealing material 34 may also provide other advantages such as thermal management, improved reliability, and reduced vibration. While the first exemplary embodiment of electronic assembly 10b shows sealing material 34 completely encapsulating all components associated with first side 14 of circuit board 12, sealing material 34 may alternatively encapsulate a smaller portion of electronic assembly 10a, or a larger portion of electronic assembly 10b, for example, also encapsulating second side 16 of circuit board 12.

Figure 1C:
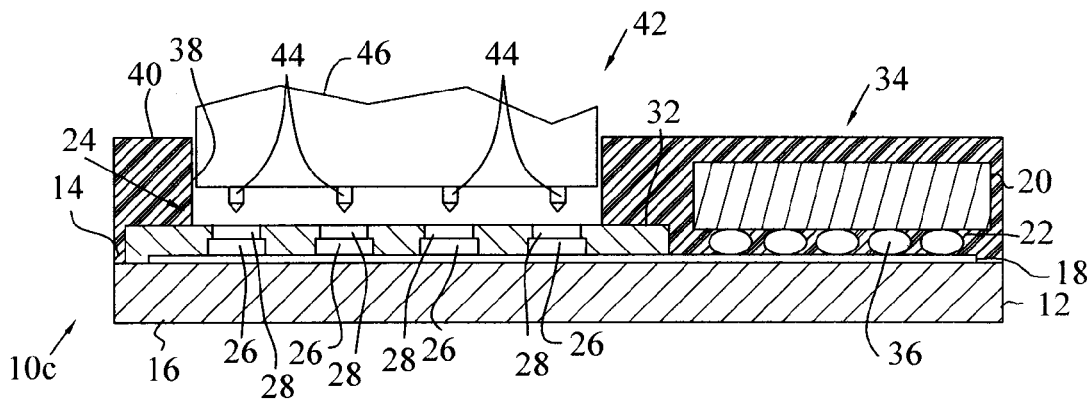
FIG. 1C is a cross-sectional elevation view of the first exemplary embodiment of FIG. 1B, showing an access cut in the sealing material and exposing the distal end of the electrical conductors.

FIG. 1C shows first exemplary electronic assembly 10c having access 38 defined in sealing material 34 from outer surface 40 of sealing material 34 toward first side 14 of circuit board 12. Advantageously, access 38 is formed to a depth extending at least to distal end 30 of electrical conductors 24, thereby exposing electrical conductors 24 for diagnostic connection. Access 38 may be formed, for example, by cutting or otherwise removing a designated portion of sealing material 34 overlaying electrical conductors 24. In first exemplary electronic assembly 10c, distal ends 30 of electrical conductors 24 extend approximately 6 mils above first side surface 14 of circuit board 12.

Advantageously, a cutting device used to form access 38 has a depth tolerance less than height of electrical conductors 24, for example, approximately 2 mils. Therefore, access 38 may be formed to a depth at least reaching distal end 30 of electrical conductors 24 while not damaging electrical circuit 18 or circuit board 12. Additionally, the cutting device may be electrically coupled with a circuit (not shown) that includes one of electrical conductors 24, therefore providing a signal upon contact of the cutting device with distal end 30 of electrical conductors 24. The cutting device may be, for example, a mechanical cutter such as an end mill, a laser, or a high-pressure stream, for example, a water jet.

Access 38 is formed so that electrical conductors 24 are accessible and may be contacted by test circuit conductor 42. Test circuit conductor 42 may include probes 44 and probe body 46, or other suitable electrical connection components for connecting electrical conductors 24 to analysis equipment. Test circuit conductor 42 may be, for example, a Gold Dot™ connection system comprising bump-shaped compression contacts directly integrated onto flexible print circuit, available from and trademark of Delphi™ Technologies, Inc., of Troy, Mich.

Figure 1D:
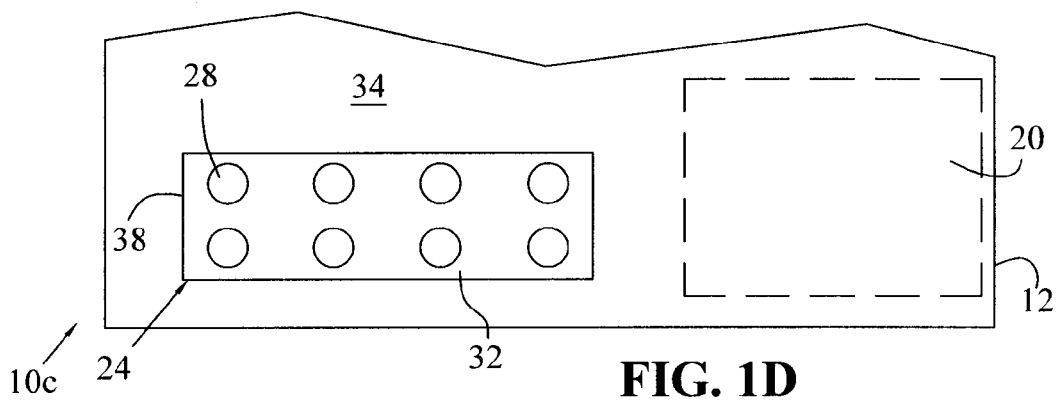
FIG. 1D is a top view of the first exemplary embodiment of FIG. 1C.

Advantageously, providing electrical conductors 24 extending distally from circuit board 12 provides diagnostic connection points for electronic assembly 10a that are accessible without a substantial risk of damaging electronic device 20, electrical circuit 18, or circuit board 12. Referring to FIG. 1D, electrical conductors 24 are located in a known pattern and area laterally that may be easily identified with reference to outer surface 40 of sealing material 34 and to circuit board 12, thereby allowing accurate location of access 38 so that access for test circuit conductor 42 is provided while avoiding damage to electronic assembly 10a while forming access 38. For example, as shown in FIG. 1D, electrical conductors 24 and access 38 may be laterally displaced from electronic device 20 so that electronic device 20 is not damaged while forming access 38.

Figure 2A:
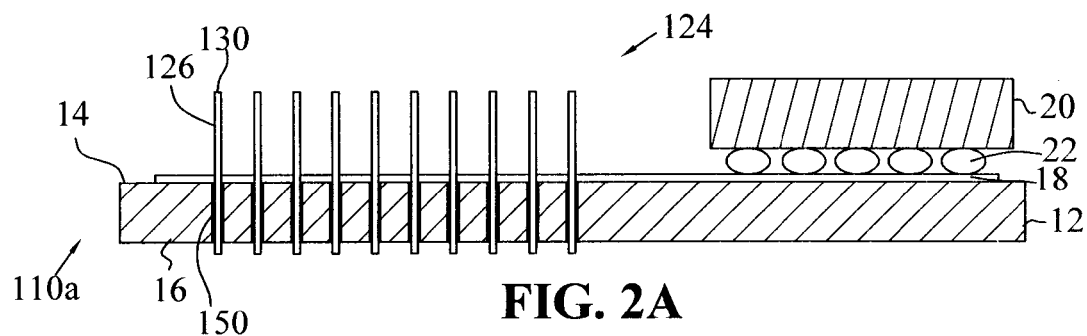
FIG. 2A is a cross-sectional elevation view of a second exemplary electronic assembly according to the present invention.
Figure 2B:
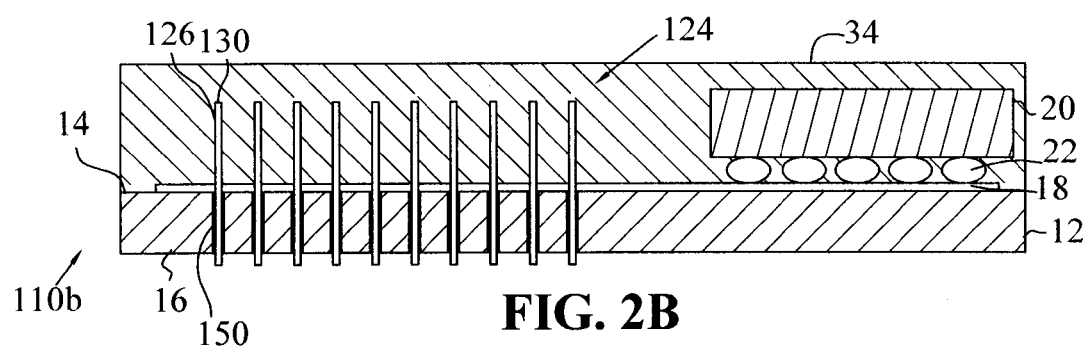
FIG. 2B is a cross-sectional elevation view of the second exemplary embodiment of FIG. 2A, showing sealing material encapsulating the electronic assembly.
Figure 2C:
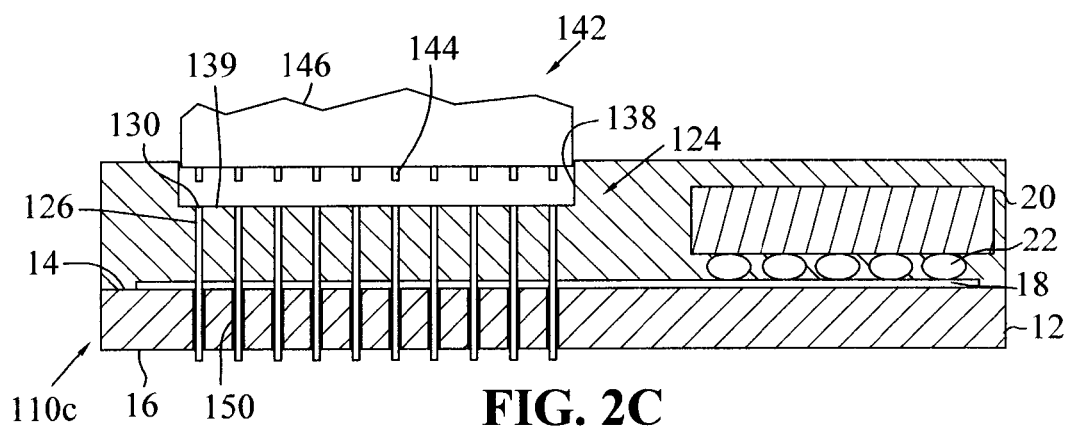
FIG. 2C is a cross-sectional elevation view of the second exemplary embodiment of FIG. 2B, showing an access cut in the sealing material and exposing the distal end of the electrical conductors.

Referring to FIGS. 2A-2C, a second exemplary embodiment according to the present invention is represented. Referring to FIG. 2A, electronic assembly 110a includes circuit board 12, having first side surface 14 and opposite second side surface 16, and electronic device 20 having solder bumps 22 coupled to electrical circuit 18. Electrical conductors 124 provide for diagnostic connection with electrical circuit 18 and electronic device 20. In second exemplary electronic assembly 110a, electrical conductors 124 include conductive pins 126 which protrude distally from first surface 14 of circuit board 12. Additionally, conductive pins 126 may extend into plated through holes 150 defined between first side 14 and second side 16 of circuit board 12. Conductive pins 126 are selectively coupled to electrical circuit 18, providing electrical continuity to particular portions of electrical circuit 18 and electronic device 20. Conductive pins 126 may include a plastic or other member (not shown) for coupling and/or spacing conductive pins 126 to circuit board 12.

Referring to FIG. 2B, electronic assembly 110b is first exemplary electronic assembly 110a of FIG. 1A having sealing material 34 encapsulating electrical conductors 124. Sealing material 34 may also encapsulate at least a portion of first side 14 of circuit board 12 and electrical device 20 and other components of electronic assembly 110a. Sealing material 34 may be a polymeric material as described above.

Referring to FIG. 2C, electronic assembly 110c is second exemplary electronic assembly 110b of FIG. 2B having access 138 formed in sealing material 34 from outer surface 40 distally toward first side 14 of circuit board 12 to a depth so that access base 139 exposes distal end 130 of conductive pins 126. Advantageously, probes 144 positioned by probe body 146 of test circuit conductor 142 provides diagnostic connection with electrical conductors 124, thereby facilitating failure analysis of electronic assembly 110c.

Second exemplary electronic assembly 110a-110c shares many of the above-mentioned characteristics of first exemplary electronic assembly 10a-10-c, and may therefore also include other above-mentioned aspects and components of electronic assembly 10a-10c. Second exemplary electronic assembly 110a-110c differs from first exemplary electronic assembly 10a-10c in the arrangement and configuration of electrical conductors 124. Although electrical conductors 124 are depicted as being substantial vertical elongate pins 126 relative to circuit board 12, pins 126 may be alternatively oriented or formed. For example, pins 126 may include two portions oriented at 90 degrees relative to one another.

Depending on the type of cutting device used for forming access 138, distal end 130 of conductive pins 126 may also be cut in order to ensure access base 139 is cut to a depth exposing distal end 130 of conductive pins 126. Similar to forming access 38 of the first embodiment, electrical continuity between conductive pins 126 and the cutting device may be used to determine access base 139 reaching distal end 130 of conductive pins 126.

Figure 3A:
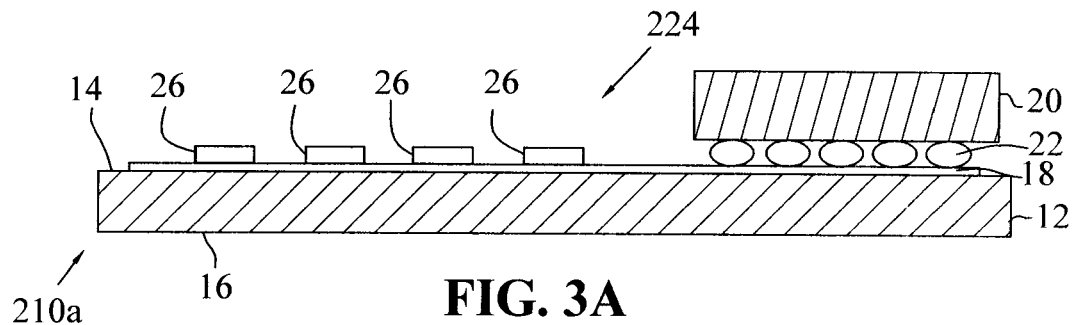
FIG. 3A is a cross-sectional elevation view of a third exemplary embodiment of an electronic assembly according to the present invention.

FIGS. 3A-3D represent third exemplary embodiment electronic assembly 210a-210d according to the present invention. Referring to FIG. 3A, electronic assembly 210a includes circuit board 12 having first side surface 14 and oppositely located second side surface 16. Electronic assembly 210a also includes electrical circuit 18 and electronic device 20 coupled to electrical circuit 18 with solder bumps 22. Electrical conductors 224 provide diagnostic connection with electrical circuit 18 and electronic device 20. Electrical conductors 224 may include, for example, circuit pads 26 which extend distally from first side 14 of circuit board 12. Similar to second exemplary electronic assembly 110a-110c, third exemplary electronic assembly 210a-210d may also include other above-described aspects and characteristics of first exemplary electronic assembly 10a-10c.

Figure 3B:
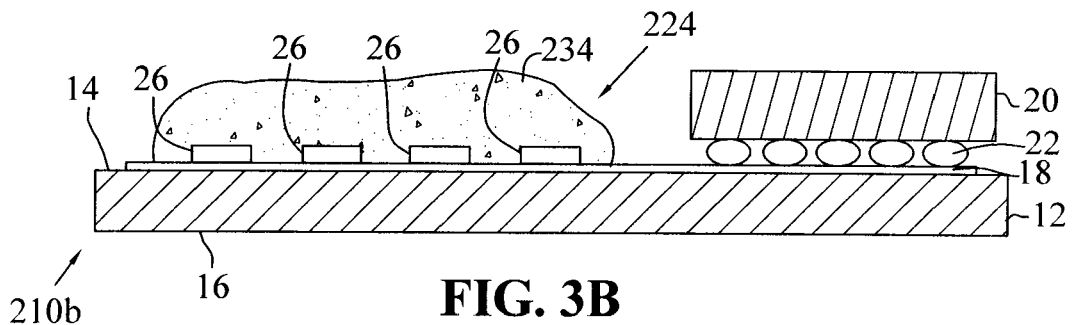
FIG. 3B is a cross-sectional elevation view of the third exemplary embodiment of FIG. 3A showing a first sealing material encapsulating the electrical conductors.

Referring to FIG. 3B, electronic assembly 210b is the third exemplary embodiment 210a of FIG. 3A having first sealing material 234 encapsulating electrical conductors 224. First sealing material 234 may be a dielectric material, for example, a synthetic polymer such as silicone material which is dispensed over electrical conductors 224. Advantageously, first sealing material 234 may be a silicone material, which is subsequently easily peeled or otherwise separated from electrical conductors 224. The advantage of using such a material is that it may be removed without using cutting devices that must precisely cut to the depth of circuit pads 26 while not so deep as to damage circuit pads 26 or circuit board 12.

Figure 3C:
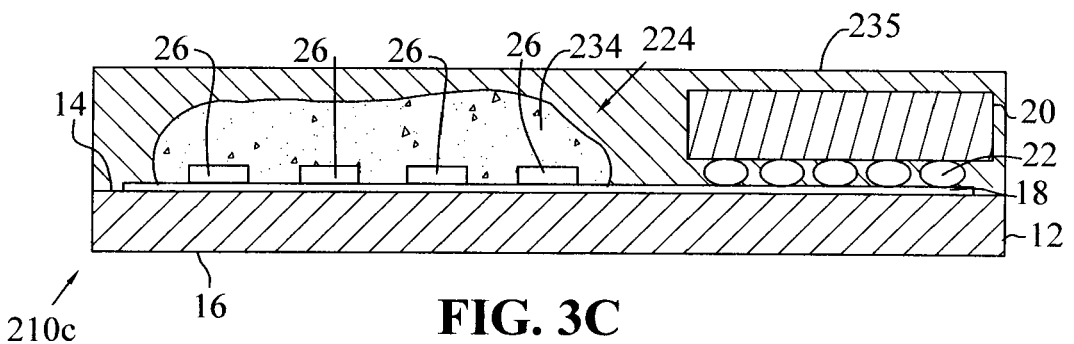
FIG. 3C is a cross-sectional elevation view of the third exemplary embodiment of FIG. 3B, showing a second sealing material encapsulating the first sealing material and the electrical assembly.

Referring to FIG. 3C, electronic assembly 210c is the third exemplary electronic assembly 210b having second sealing material 235 encapsulating first sealing material 234. Second sealing material 235 may also encapsulate first side 14 of circuit board 12 and electronic device 20, and be a polymeric material as described above.

Figure 3D:
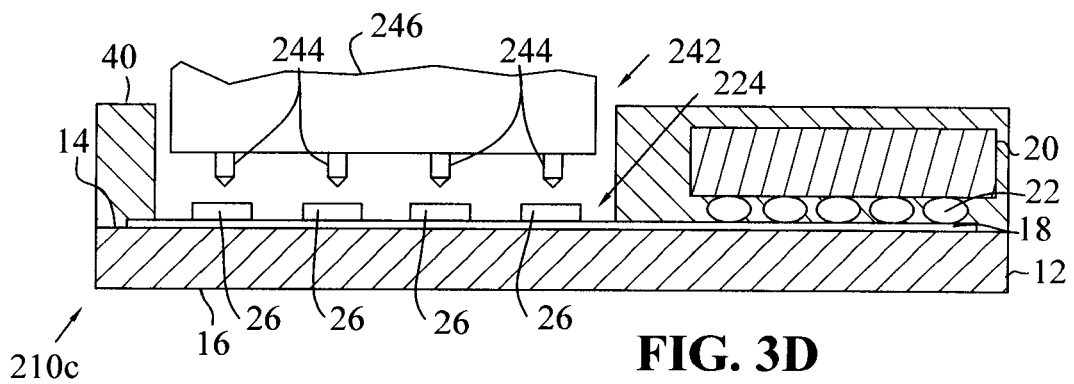
FIG. 3D is a cross-sectional elevation view of the third exemplary embodiment of FIG. 3C, showing a portion of the first and second sealing material removed to form an access for providing access to the electrical conductors.

Referring to FIG. 3D, electronic assembly 210d is the third exemplary electronic assembly 210c of FIG. 3C having an access 238 defined in second sealing material 235. Specifically, a portion of outer surface 40 overlying first sealing material 234 may be removed, for example, by one of the above-mentioned cutting devices (not shown), in order to expose and provide access to first sealing material 234. Subsequent to removal of a portion of second sealing material 235, first sealing material 234 may then be removed from contact with electrical conductors 224 and first side 14 of circuit board 12, thereby forming access 238. Subsequent to forming access 238, test circuit conductor 242 may be utilized to provide a diagnostic connection with electrical conductors 124. Test circuit conductor 242 may include, for example, probes 244 and probe body 246 as shown in FIG. 3D.

Figure 4A:
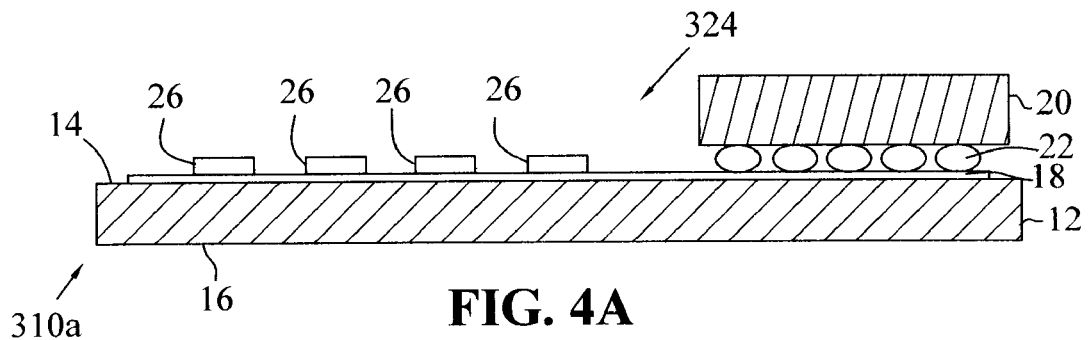
FIG. 4A is a cross-sectional elevation view of a fourth exemplary embodiment of an electronic assembly according to the present invention.
Figure 4B:
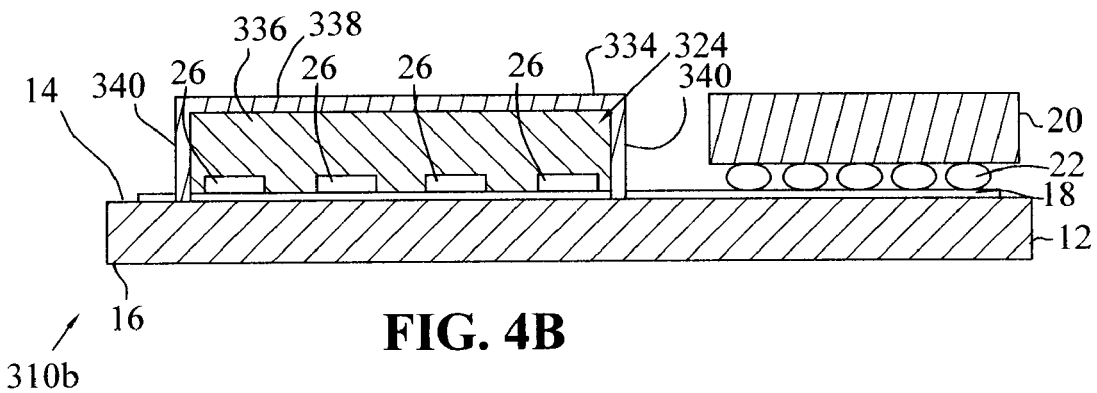
FIG. 4B is a cross-sectional elevation view of the fourth exemplary embodiment of FIG. 4A showing a first sealing material encapsulating the electrical conductors.

FIGS. 4A-4D represent fourth exemplary electronic assembly 310a-310d according to the present invention. Electronic assembly 310a-310d resemble third exemplary electronic assembly 210a-210d except that first sealing material 234 is replaced with protective cover 334, for example, a plastic cap which encapsulates electrical conductors 324. Referring to FIG. 4B, protective cover 334 may be coupled to first side 14 of circuit board 12, for example, by adhesive bonding.

Advantageously, protective cap 334 is shaped and sized to provide a substantially impermeable seal against first side 14 of circuit board 12, thereby protecting electrical conductors 324 from exposure to second sealing material 335 (FIG. 4C) or environmentals such as moisture. For example, as shown in the cross-sectional view of FIG. 4B, which cuts between opposite side walls 336 of cap 334, protective cap 334 may be a rectilinear box having a single open side facing circuit board 12, top 338, end walls 340, and side walls 336.

Figure 4C:
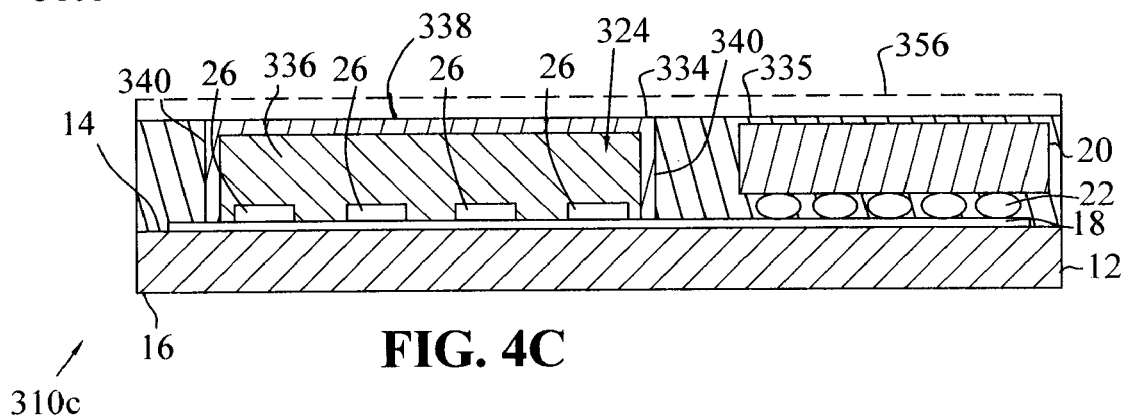
FIG. 4C is a cross-sectional elevation view of the fourth exemplary embodiment of FIG. 4B, showing a second sealing material encapsulating the first sealing material in the electrical assembly.

Referring to FIG. 4C, second sealing material 335, for example, a polymeric material as described above, may be subsequently used to encapsulate protective cover 334, extending to optional height 356, and also to encapsulate first side 14 of circuit board 12 and electronic device 20. Alternatively, second material 335 may surround protective cover 334 while encapsulating first side 14 of circuit board 12 and electronic device 22, for example, extending to the same height as protective cover 334, as shown in FIG. 4C.

Figure 4D:
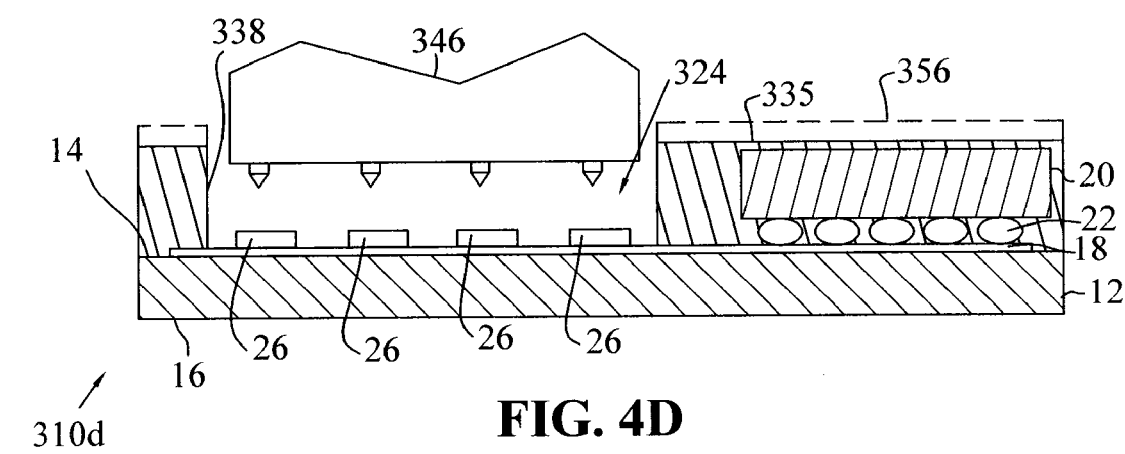
FIG. 4D is a cross-sectional elevation view of the fourth exemplary embodiment of FIG. 4C, showing a portion of the first and second sealing material removed to form an access for providing access to the electrical conductors.

Referring to FIG. 4D, to provide diagnostic connection to electrical circuit 18 and electronic device 20 via electrical conductors 324, protective cap 334, and second material 335 overlying protective cover 334 may be removed, for example, by using one of the above-discussed cutting devices (not shown). Advantageously, if second material, 335 does not extend distally from first side 14 to optional level 356, which covers top 338 of cover 33A, then a portion of or the entire cover 334 may be removed from electronic assembly 310d, forming access 338, without having to employ a cutting device to remove second material 335.

Although described in the exemplary embodiments, it will be understood that various modifications may be made to the subject matter without departing from the intended and proper scope of the invention. The application is therefore intended to cover any variations, uses, or adaptations of the invention using its general principles. Further, this application is intended to cover such departures from the present disclosure as come within known or customary practice in the art to which this invention pertains.

The invention claimed is:

1. A method of providing a diagnostic connection for an over-molded electronic package including a circuit board and an electronic component mounted on the circuit board, comprising the steps of:

forming electrical conductors on a first side of the circuit board laterally displaced from said electronic component, the electrical conductors having distal ends projecting above the first side of the circuit board;

over-molding the circuit board, the electronic component and the electrical conductors with an encapsulating material; and selectively removing a portion of the encapsulating material that overlies said electrical conductors without disturbing other portions of the encapsulating material to form a cavity in the encapsulating material with the distal ends of the electrical conductors being exposed at a floor of the cavity for access to a diagnostic probe inserted into said cavity.

2. The method of claim 1, including the steps of:

dispensing a sealing material onto said electrical conductors before over-molding the circuit board, the electronic component and the electrical conductors with said encapsulating material; and first removing the portion of the encapsulating material that overlies said electrical conductors and then removing a portion of the sealing material that overlies said electrical conductors to form said cavity.

3. A method of providing a diagnostic connection for an over-molded electronic package including a circuit board and an electronic component mounted on the circuit board, comprising the steps of:

forming electrical conductors on a first side of the circuit board laterally displaced from said electronic component, the electrical conductors having distal ends projecting above the first side of the circuit board;

providing a protective box having an open end, and securing said box to said circuit board about said electrical conductors with said open end facing said circuit board so as to define a closed volume of air overlying said electrical conductors;

over-molding at least the circuit board and the electronic component with an encapsulating material; and removing a wall of said protective box that overlies said electrical conductors to expose the closed volume of air overlying said electrical conductors to thereby form said a cavity in the encapsulating material with the distal ends of the electrical conductors being exposed at a floor of the cavity for access to a diagnostic probe inserted into said cavity.

4. The method of claim 3 including the steps of:

over-molding the circuit board, the protective box, and the electronic component with said encapsulating material; and first removing a portion of the encapsulating material that overlies said electrical conductors and then removing the wall of said protective box that overlies said electrical conductors.

* * * * *